US012717229B2

(12) United States Patent
Zi et al.

(10) Patent No.: US 12,717,229 B2
(45) Date of Patent: Aug. 25, 2026

(54) METHODS AND MATERIALS FOR METALLIC PHOTORESIST

(71) Applicant: Taiwan Semiconductor Manufacturing Company, Hsinchu (TW)

(72) Inventors: An-Ren Zi, Hsinchu (TW); Ching-Yu Chang, Yilang County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 582 days.

(21) Appl. No.: 18/102,447

(22) Filed: Jan. 27, 2023

(65) Prior Publication Data

US 2024/0288767 A1 Aug. 29, 2024

(51) Int. Cl.

*G03F 7/004* (2006.01)
*G03F 7/30* (2006.01)
*G03F 7/16* (2006.01)

(52) U.S. Cl.

CPC .......... *G03F 7/0043* (2013.01); *G03F 7/0042* (2013.01); *G03F 7/0044* (2013.01); *G03F 7/30* (2013.01); *G03F 7/168* (2013.01)

(58) Field of Classification Search

CPC ..... G03F 7/0042; G03F 7/0073; G03F 7/0043
See application file for complete search history.

(56) References Cited

U.S. PATENT DOCUMENTS 6,344,516 B1 * 2/2002 Ikeda .................... C08G 61/10 524/718
2019/0384171 A1 * 12/2019 Zi .......................... G03F 7/322
2020/0387068 A1 * 12/2020 Sakai .................... G03F 7/0042
2021/0063876 A1 3/2021 Zi et al.

(Continued)

FOREIGN PATENT DOCUMENTS

CN 111948904 A 11/2020
TW 201307996 A 2/2013

(Continued)

OTHER PUBLICATIONS

Kuznetsova, S. & Konstantin, L. (2017). Synthesis of tin (II) oxide from tin (II) oxohydroxide. AIP Conference Proceedings, 1899(1) 020005-1 to 020005-6. https//doi.org/10.1063/1.15009830. (Year: 2017).*

(Continued)

*Primary Examiner* — John S. Chu
(74) *Attorney, Agent, or Firm* — Lippes Mathias LLP

(57) ABSTRACT

Methods and materials for improving the thermal stability of a metallic photoresist are disclosed. The metallic photoresist may comprise a metal core and one or more ligands, where each ligand is saturated and comprises from 1 to about 8 carbon atoms and at least two nitrogen atoms. Alternatively, a cross-linker may be used with the metallic photoresist, the cross-linker comprising a metal core and a plurality of cross-linking groups and having a molecular weight of about 1000 or less. Finally, an additive comprising carbonate or bicarbonate anions may be added during the formation of a (Continued)

developed photoresist layer. Each of these methods, independently or together, improve the thermal stability of the metallic photoresist, permitting improved line resolution.

14 Claims, 7 Drawing Sheets

(56) References Cited

U.S. PATENT DOCUMENTS

| | | | | |
|---|---|---|---|---|
| 2022/0026807 | A1* | 1/2022 | Kalutarage | G03F 7/168 |
| 2022/0028691 | A1* | 1/2022 | Kalutarage | H01L 21/02271 |
| 2022/0035247 | A1* | 2/2022 | Tan | G03F 7/091 |

FOREIGN PATENT DOCUMENTS

| | | | |
|---|---|---|---|
| TW | 201538536 | A | 10/2015 |
| TW | 202132621 | A | 9/2021 |
| WO | 2021072042 | A1 | 4/2021 |
| WO | 2022016128 | A1 | 1/2022 |

OTHER PUBLICATIONS

Taiwan Office Action Application No. 11320467790 Dated: May 13, 2024.

Taiwan Office Action Dated, Application No. 11320084990, Jan. 29, 2024.

Tokahiro Kozawa, Radiation Chemistry in Chemically Amplified Resists, Japanese Journal of Applied Physics, published online Mar. 23, 2010.

B.L. Henke, X-Ray Interactions: Photoabsorption, Scattering, Transmission, and Reflection at E=50-30,000 eV, Z=1-92, Atomic Data and Nuclear Data Tables, pp. 181-342, vol. 54 No. 2, Published Jul. 1993 by Academic Press, Inc.

Wolf Schmid, Sensing of Hydrocarbons with Tin Oxide Sensors: Possible Reaction Path as Revealed by Consumption Measurements, Sensors and Actuators vol. 89 B, pp. 232-236, Published 2003 by Elsevier Science B.V.

* cited by examiner

200

202
200

206
204
202
200

215
210
206
204
202
200

214
212
214
212
214
210
206
204
202
200

210
206
204
202
200

METHODS AND MATERIALS FOR METALLIC PHOTORESIST

BACKGROUND

Integrated circuits are formed on a semiconductor wafer. Photolithographic patterning processes use ultraviolet light to transfer a desired mask pattern to a photoresist on a semiconductor wafer. Etching processes may then be used to transfer to the pattern to a layer below the photoresist. This process is repeated multiple times with different patterns to build different layers on the wafer substrate and make a useful device.

High-resolution lithography processes are needed to obtain smaller feature sizes. An example of one such process is extreme ultraviolet (EUV) lithography, which uses wavelengths of about 10 nanometers (nm) to about 100 nm. Further improvements are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
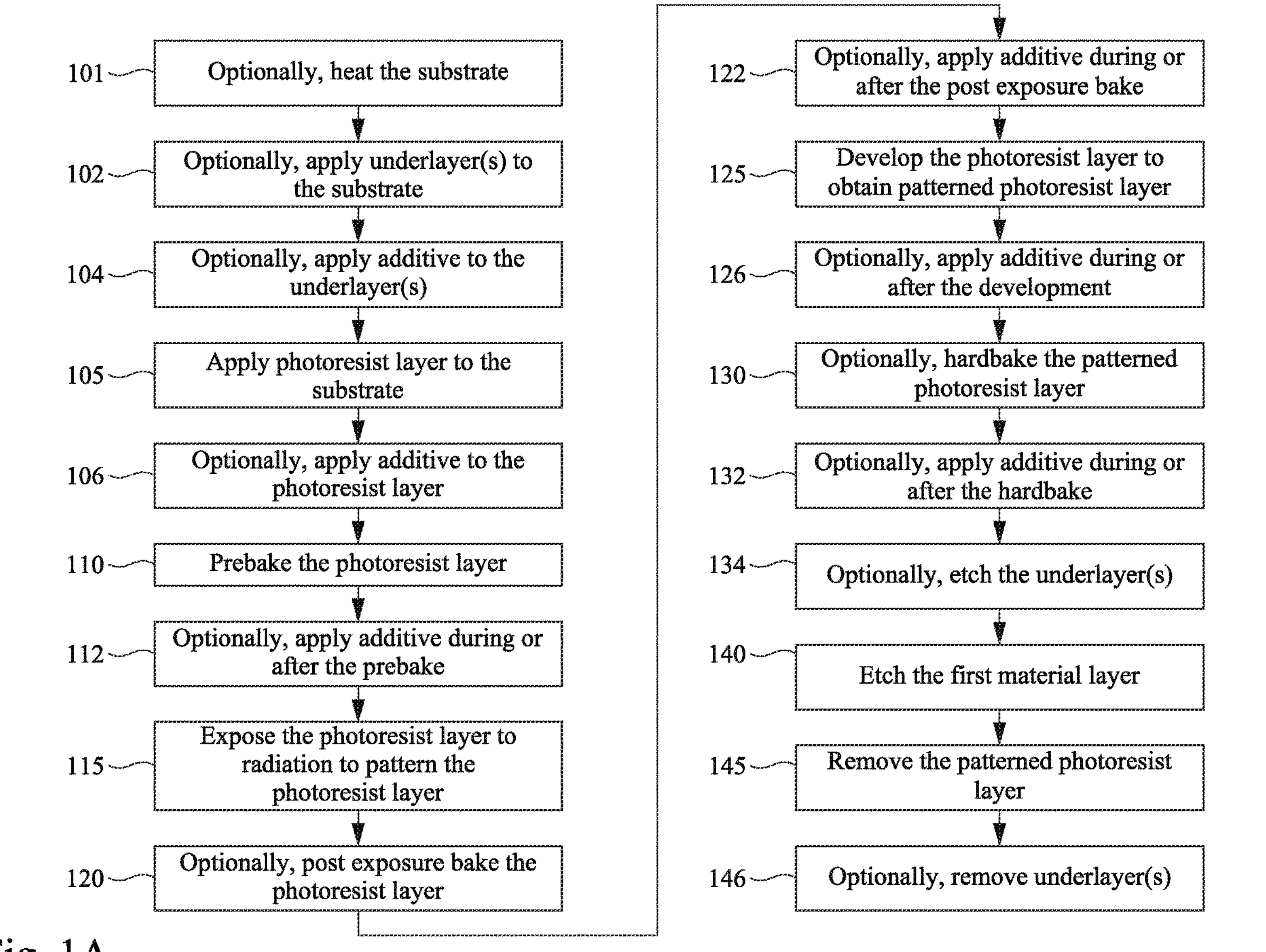
FIG. 1A is a flow chart illustrating a method for preparing a patterned photoresist layer and etching a layer of a semiconducting device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "about" can be used to include any numerical value that can vary without changing the basic function of that value. When used with a range, "about" also discloses the range defined by the absolute values of the two endpoints, e.g. "about 2 to about 4" also discloses the range "from 2 to 4." The term "about" may refer to plus or minus 10% of the indicated number.

The term "alkyl" is used herein to refer to a radical composed from a chain of carbon atoms which is fully saturated (i.e. contains only single bonds). The alkyl radical may be linear, branched, or cyclic. The carbon atoms are saturated with hydrogen or fluorine atoms.

The present disclosure may refer to temperatures for certain process steps. It is noted that these generally refer to the temperature at which the heat source (e.g. furnace) is set, and do not necessarily refer to the temperature which must be attained by the material being exposed to the heat.

The term "ambient temperature" or "room temperature" refers to a temperature of 20° ° C. to 25° C.

The present disclosure relates to structures which are made up of different layers. When the terms "on" or "upon" are used with reference to two different layers (including the substrate), they indicate merely that one layer is on or upon the other layer. These terms do not require the two layers to directly contact each other, and permit other layers to be between the two layers. For example all layers of the structure can be considered to be "on" the substrate, even though they do not all directly contact the substrate. The term "directly" may be used to indicate two layers directly contact each other without any layers in between them. In addition, when referring to performing process steps to the substrate, this should be construed as performing such steps to whatever layers may be present on the substrate as well, depending on the context.

The present disclosure relates to various methods for improving the operation of a metallic photoresist. In this regard, chemically amplified photoresist may be considered as operating through a multi-step reaction mechanism. First, when exposed to EUV radiation, the photoresist absorbs photons from the radiation. Second, secondary electrons are emitted by the photoresist, and thermal electrons are also generated. Third, photo-acid generators (PAGs) react with these electrons to generate photoacids. Fourth, the photoacids diffuse through the photoresist matrix. Fifth and last, the photoacid catalyzes the degradation of acid-sensitive groups from the photoresist, also known as deprotection. The photoacid is not consumed in this reaction, and can thus catalyze multiple deprotection reactions. The deprotected photoresist differs from the original photoresist in solubility. This difference in the photoresist between exposed areas and non-exposed areas permits patterning of the photoresist, which is used to build different layers on the wafer substrate.

A metallic photoresist includes metal atoms to increase photon absorption, i.e. the first step of the reaction mechanism. However, the thermal stability of the metallic photoresist may be too low during subsequent steps for patterning the photoresist. For example, during baking, unexpected reactions may occur in the non-exposed areas, causing the resulting pattern to be different from the desired pattern.

The present disclosure relates to different methods for avoiding such problems with the thermal stability of the metallic photoresist while still obtaining good results with smaller radiation dosages. First, the metallic photoresist may contain particular ligand structures. Second, the photoresist solution may contain a metallic cross-linker having a particular structure. Third, the photoresist may be exposed to an additive containing carbonate or bicarbonate anions during the photoresist development process. These aspects are discussed in more detail below. Initially, the metallic photoresist, the metallic cross-linker, and the additive containing carbonate or bicarbonate ions will be described. Next, other components that may be present in photoresist solutions and methods for using the photoresist solutions will be described.

Metallic Photoresist

The metallic photoresist of the present disclosure comprises a metal core and one or more ligands attached to or connected to the metal core. The ligand(s) may be attached via covalent, ionic, or metallic bonds or via van der Waals forces to the metal core.

The metal core of the metallic photoresist includes a metallic element. The metallic element may be present as a pure metal (i.e. atom), an ion, a compound (for example a metal oxide, metal nitride, metal oxynitride, metal silicide, metal carbide, etc.), or as an alloy of multiple metal atoms. Desirably, the metallic element has a high EUV photoabsorption. Examples of suitable metallic elements include silver (Ag), cadmium (Cd), indium (In), tin (Sn), antimony (Sb), tellurium (Te), cesium (Cs), gold (Au), mercury (Hg), titanium (Ti), lead (Pb), bismuth (Bi), polonium (Po), astatine (At), barium (Ba), lanthanum (La), cerium (Ce), hafnium (Hf), zirconium (Zr), chromium (Cr), tungsten (W), molybdenum (Mo), iron (Fe), ruthenium (Ru), osmium (Os), cobalt (Co), rhodium (Rh), iridium (Ir), nickel (Ni), palladium (Pd), platinum (Pt), copper (Cu), zinc (Zn), aluminum (Al), gallium (Ga), thallium (Tl), and germanium (Ge). In more specific embodiments, the metal core of the metallic photoresist comprises Ag, Cd, In, Sn, Sb, Te, Cs, Au, Hg, Ti, Pb, Bi, Po, At, Ba, La, or Ce. The metallic elements in the metal core of the metallic photoresist may comprise from about 0.01 wt % to about 7 wt % of the photoresist solution. In some particular embodiments, only one metallic element is present in the metal core. In other embodiments, multiple metallic elements are present in the metal core.

The ligand(s) are attached to the metal core, and this attachment determines whether the photoresist is soluble or insoluble when exposed to developer. One function of the ligand(s) is to protect the metal core from condensation prior to radiation exposure. The ligands are cleaved from the metal core during radiation exposure. In particular embodiments, there are from 1 to about 18 ligands attached to the metal core. Without being bound by theory, it is believed that these ligands have high thermal stability due to the presence of the lone electron pair which can form a hydrogen bond with for example other ligands, and thus will not be cleaved through subsequent heat treatment steps.

Each ligand comprises from 1 to about 8 carbon atoms, and also has at least two (2) nitrogen atoms. In some particular embodiments, the nitrogen atoms comprise at least 8 atomic percent of the ligand. Put another way, if the ligand had 100 atoms, at least 8 of the atoms would be nitrogen atoms. In particular embodiments, the ligand contains 2 or 3 nitrogen atoms. The ligand may be linear, branched, or cyclic.

In addition, each ligand is saturated (i.e. has only single bonds). In some particular embodiments, it is contemplated that each carbon atom is saturated with only hydrogen or fluorine atoms. However, in some other embodiments, other substituents may be present, for example —OH, —SH, $—NO_2$, $—SO_2R$, $—SO_3R$, —CN, —COR, $—CO_2R$, or $—CONR_2$, wherein each R is independently hydrogen or alkyl.

Some examples of suitable ligands are illustrated below. For ease of reference, the metal core is illustrated as an M surrounded by a circle, and only one ligand is illustrated as being attached to the metal core via a covalent bond.

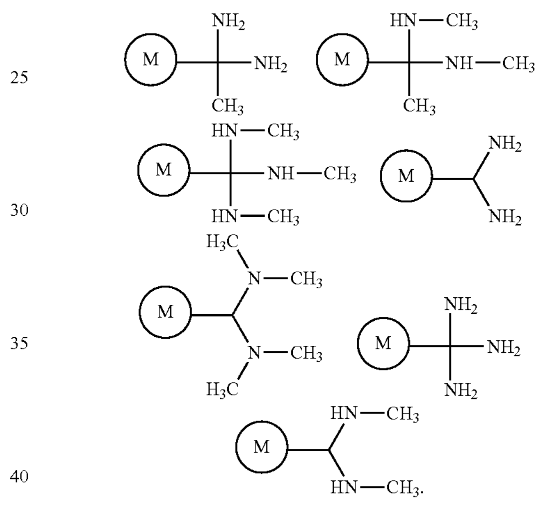

In some particular embodiments, each ligand has a minimum molecular weight of about 40. In some particular embodiments, each ligand has a maximum molecular weight of about 150. In more particular embodiments, each ligand has a molecular weight of about 40 to about 150, or from about 45 to about 105.

The individual ligands themselves can be synthesized using conventional methods known in the art. The metal core can also be synthesized using conventional methods known in the art. The ligand(s) can be attached to the metal core using conventional methods known in the art.

The metallic photoresist is suited for EUV photolithography processes where a pitch of less than 40 nanometers (nm) is desired. The ligands by themselves are highly soluble in the developer, which means they are more easily rinsed away and improves line width roughness (LWR) at the reduced exposure doses provided by EUV. It is contemplated that the LWR will be improved by at least 5% compared to conventional photoresist.

Metallic Cross-Linker

Next, the metallic cross-linker of the present disclosure comprises a metal core and a plurality of cross-linking groups. The cross-linking groups may be directly attached to the metal core, or attached to the metal core through a saturated linking group. The saturated linking groups are usually attached to the metal core via covalent bonds, but attachment through ionic or metallic bonds or via van der Waals forces is also contemplated. The molecular weight of the cross-linker is about 1000 or less.

The metal core of the metallic cross-linker includes a metallic element. The metallic element may be present as a pure metal (i.e. atom), an ion, a compound (for example a metal oxide, metal nitride, metal oxynitride, metal silicide, metal carbide, etc.), or as an alloy of multiple metal atoms. Desirably, the metallic element has a high EUV photoabsorption. Examples of suitable metallic elements include silver (Ag), cadmium (Cd), indium (In), tin (Sn), antimony (Sb), tellurium (Te), cesium (Cs), gold (Au), mercury (Hg), titanium (Ti), lead (Pb), bismuth (Bi), polonium (Po), astatine (At), barium (Ba), lanthanum (La), cerium (Ce), hafnium (Hf), zirconium (Zr), chromium (Cr), tungsten (W), molybdenum (Mo), iron (Fe), ruthenium (Ru), osmium (Os), cobalt (Co), rhodium (Rh), iridium (Ir), nickel (Ni), palladium (Pd), platinum (Pt), copper (Cu), zinc (Zn), aluminum (Al), gallium (Ga), thallium (Tl), and germanium (Ge). In more specific embodiments, the metal core of the cross-linker comprises Ag, Cd, In, Sn, Sb, Te, Cs, Au, Hg, Ti, Pb, Bi, Po, At, Ba, La, or Ce. The metallic elements in the metal core of the metallic cross-linker may comprise from about 0.001 wt % to about 5 wt % of the photoresist solution. In some particular embodiments, only one metallic element is present in the metal core. In other embodiments, multiple metallic elements are present in the metal core.

In particular embodiments, the metal core of the cross-linker further comprises oxygen, such that the metal core may be described as being formed from a metal oxide. In other embodiments, the metal core further comprises saturated carbon linkages between metal atoms. The metal core may be linear, branched, or cyclic, and in some cases may be three-dimensional.

Three illustrative examples of linear metal cores are illustrated below:

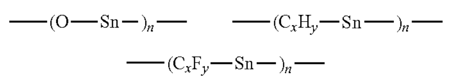

where x is 1 to 20, y=2x, and n is 1 to 20. It is noted that in these particular examples, the metal atom (tin) has an oxidation state of +2, although this is not required.

Some examples of branched metal cores are illustrated below:

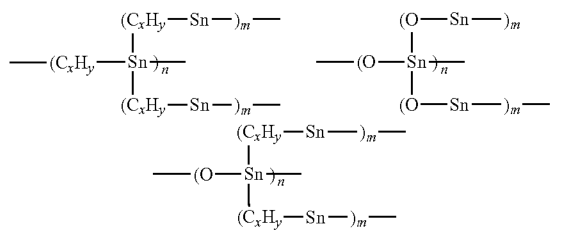

where x is 1 to 20, y=2x, and m and n are independently 1 to 20. In other particular embodiments, n is 1 to 20, m is 0 to 10, and m+n together equal 1 to 20. The saturated carbon linkages in these particular examples are shown with hydrogen atoms, however it is contemplated that each carbon atom can be saturated with hydrogen atoms or fluorine atoms or a mixture thereof.

Some examples of cyclic metal cores are illustrated below:

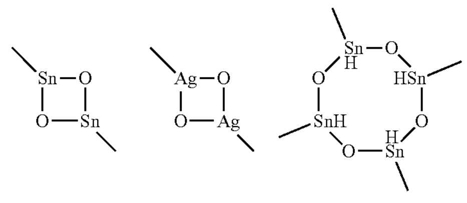

It is noted that in these particular examples, the tin atom has an oxidation state of +3 or +4, and the silver atom has an oxidation state of +3.

An example of a three-dimensional metal core is illustrated below:

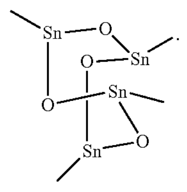

Some non-limiting examples of cross-linking groups present in the cross-linker include —OH, —$CO_3R$, —COOR, —$NH_2$, —SH, and —C═$CH_2$, wherein R is hydrogen or alkyl.

As previously mentioned, the cross-linker may also include saturated linking groups between the metal core and at least one of the cross-linking groups. In particular embodiments, the saturated linking group comprises from 1 to about 20 carbon atoms. In some embodiments, the saturated linking group is the same as the saturated carbon linkages between the metal atoms in the metal core.

Some specific non-limiting examples of the metallic cross-linker are illustrated below:

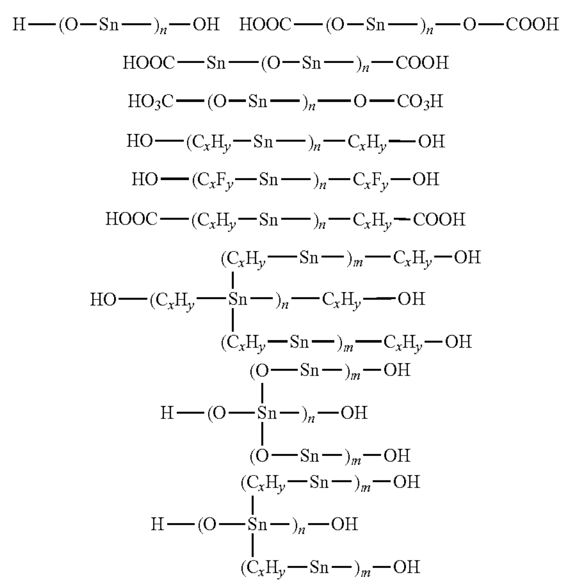

-continued

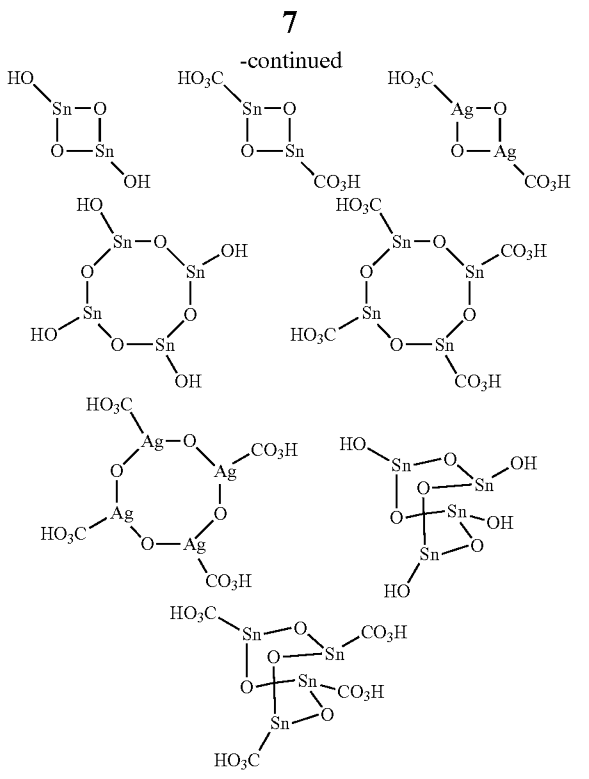

where x is 1 to 20, y=2x, and m and n are independently 1 to 20. Again, it is noted that the metallic cross-linker has a molecular weight of about 1000 or less.

As an illustrative example, the cross-linker of the formula HOOC—$(C_xH_y$—Sn—$)_n$—$C_xH_y$—COOH contains two —COOH cross-linking groups, a metal core of the formula —$(C_xH_y$—Sn—$)_n$—, and a saturated linking group of the formula —$C_xH_y$— between the metal core and one of the —COOH cross-linking groups.

When used, the metallic cross-linker is used in an amount of about 0.1 wt % to about 30 wt % relative to the metallic photoresist, or in other words 0.1 to 30 parts by weight relative to 100 parts by weight of the metallic photoresist. The metallic element(s) in the metal core of the metallic cross-linker may be the same as or different from the metallic element(s) in the metal core of the metallic photoresist.

When exposed to radiation, the cross-linking groups react, resulting in cross-links between the metallic photoresist and the cross-linker. The metal core remains stable, because the radiation energy is not sufficient to break the bonds within the metal core. In addition, without being bound by theory, the covalent bonds within the metallic cross-linker will not be cleaved through subsequent heat treatment steps.

Additive Containing Carbonate or Bicarbonate Anions

During the photoresist development process, the photoresist can be exposed to an additive containing carbonate or bicarbonate anions. Carbonate anions are of the formula $CO_3$, and have a formal charge of −2. Bicarbonate anions are of the formula $HCO_3$, and have a formal charge of −1. In contrast to the metallic photoresist and the metallic cross-linker, the additive does not contain metal.

Examples of additives containing carbonate or bicarbonate anions include $Na_2CO_3$, $CaCO_3$, $BaCO_3$, $K_2CO_3$, $MgCO_3$, $(NH_4)_2CO_3$, $KHCO_3$, $NaHCO_3$, $H_2CO_3$, $Ca(HCO_3)_2$, and $NH_4HCO_3$.

The additive is typically provided in a liquid form, for example as a treatment solution in which the additive can be dissolved. The solvent may be, for example, water, propylene glycol methyl ether acetate (PGMEA), propylene glycol monomethyl ether (PGME), 1-ethoxy-2-propanol (PGEE), gamma-butyrolactone (GBL), cyclohexanone (CHN), ethyl lactate (EL), methanol, ethanol, propanol, n-butanol, acetone, dimethylformamide (DMF), isopropyl alcohol (IPA), tetrahydrofuran (THF), methyl isobutyl carbinol (MIBC), n-butyl acetate (nBA), or 2-heptanone (MAK). In some embodiments, the additive may be dissolved to a final concentration of about 500 ppm to about 500,000 ppm (i.e. about 0.05 wt % to about 50 wt %).

In other embodiments, if the additive is liquid at the operating temperature, the concentration of the additive may be 100%. For example, $(NH_4)_2CO_3$ has a melting point of about 58° C. and $NH_4HCO_3$ has a melting point of about 42° C., which is within the operating temperatures of some steps in the photoresist development process. Put another way, no solvent is needed if the additive is liquid, and the treatment solution may comprise only the additive itself. Thus, the additive may be present in the treatment solution in an amount of about 0.01 wt % to about 100 wt %.

A treatment solution containing these additives may be heated prior to their use to obtain a liquid, for example up to a temperature of about 200° C. The additive is used in an amount of about 0.01 wt % to about 50 wt % relative to the metallic photoresist.

As will be described in further detail herein, the photoresist development process includes the steps of coating the substrate, a prebake or softbake, radiation exposure, an optional post-exposure bake, development, and an optional hardbake. The additive containing carbonate or bicarbonate anions can be used during any of these process steps, or could be used between any of the process steps. The additive may be provided in a liquid phase or a gas/vapor phase, depending on the operating temperature and pressure of the particular process step.

Photoresist Solution and Process

A photoresist solution is generally used to prepare a photoresist layer on a semiconducting wafer substrate. The photoresist solution includes a photoresist, which may be a metallic photoresist as described above. The photoresist solution may also include a cross-linker, which may be a metallic cross-linker as described above. Another component of the photoresist solution may include a solvent in which the photoresist and cross-linker are carried. In particular embodiments, the solvent may be PGMEA, PGME, PGEE, GBL, cyclohexanone, ethyl lactate, methanol, ethanol, propanol, n-butanol, acetone, DMF, isopropyl alcohol (IPA), THF, MIBC, n-butyl acetate, or MAK.

Again, the metallic elements in the metal core of the metallic photoresist may comprise from about 0.01 wt % to about 7 wt % of the photoresist solution. The metallic elements in the metal core of the metallic cross-linker may comprise from about 0.001 wt % to about 5 wt % of the photoresist solution. Alternatively, the metallic cross-linker is used in an amount of about 0.1 wt % to about 30 wt % relative to the metallic photoresist.

It is also contemplated that the metallic cross-linker may be used with a conventional organic chemically amplified resist. In such embodiments, the photoresist solution may include an organic polymer, a photoacid generator, and a quencher. Upon exposure to radiation, the photoacid generator decomposes to generate a photoacid. The photoacid catalyzes chemical reactions which change the solubility of the organic polymer. Quenchers are used to enhance pattern solution by neutralizing acid which may diffuse into non-exposed areas of the photoresist.

Figure 1B:
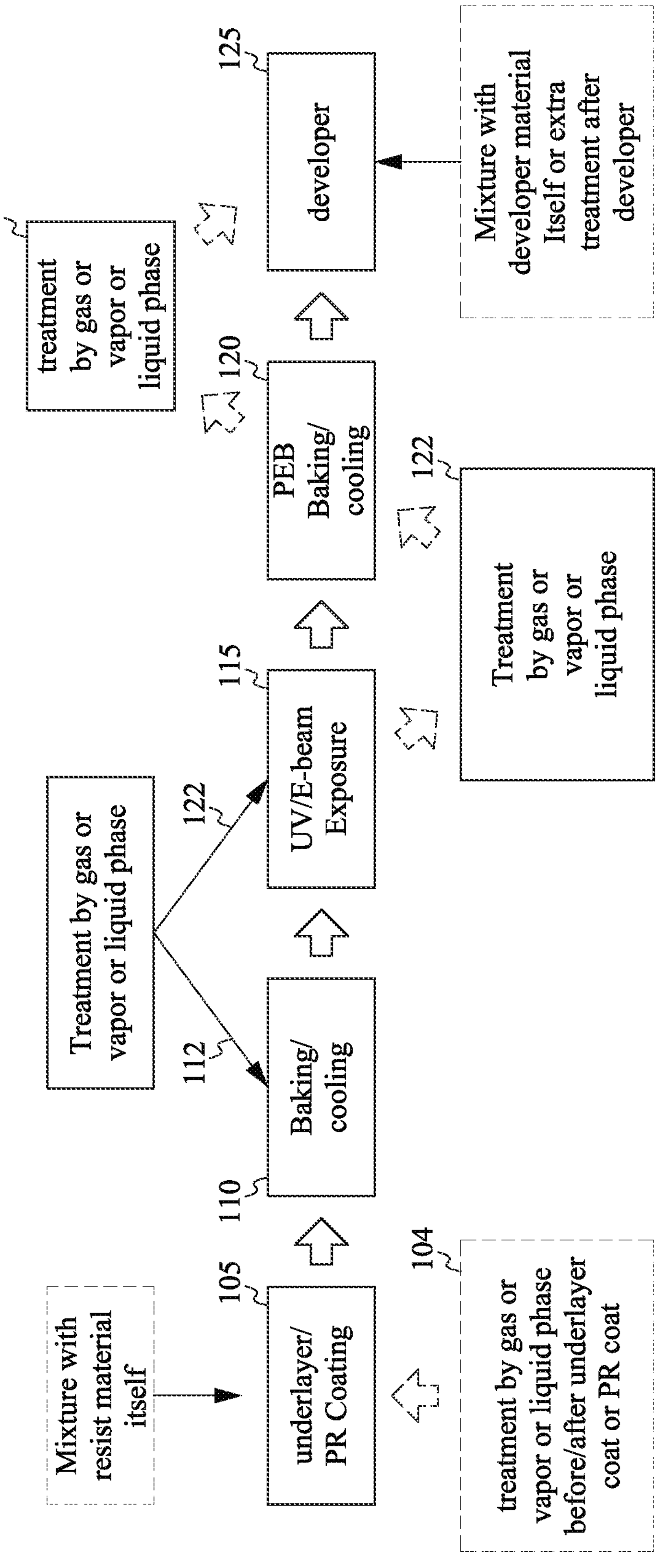
FIG. 1B is a second flow chart illustrating other aspects of the method.

FIG. 1A is a flow chart illustrating a method 100 for preparing a patterned photoresist layer and etching a layer of a semiconducting device, in accordance with some embodiments. FIG. 1B is another flow chart illustrating other aspects of the method. In the discussion below, FIG. 1A will generally be referred to. Some steps of the method are also illustrated in FIGS. 2A-7. These figures provide different views for better understanding.

Figures 2A, 2B:
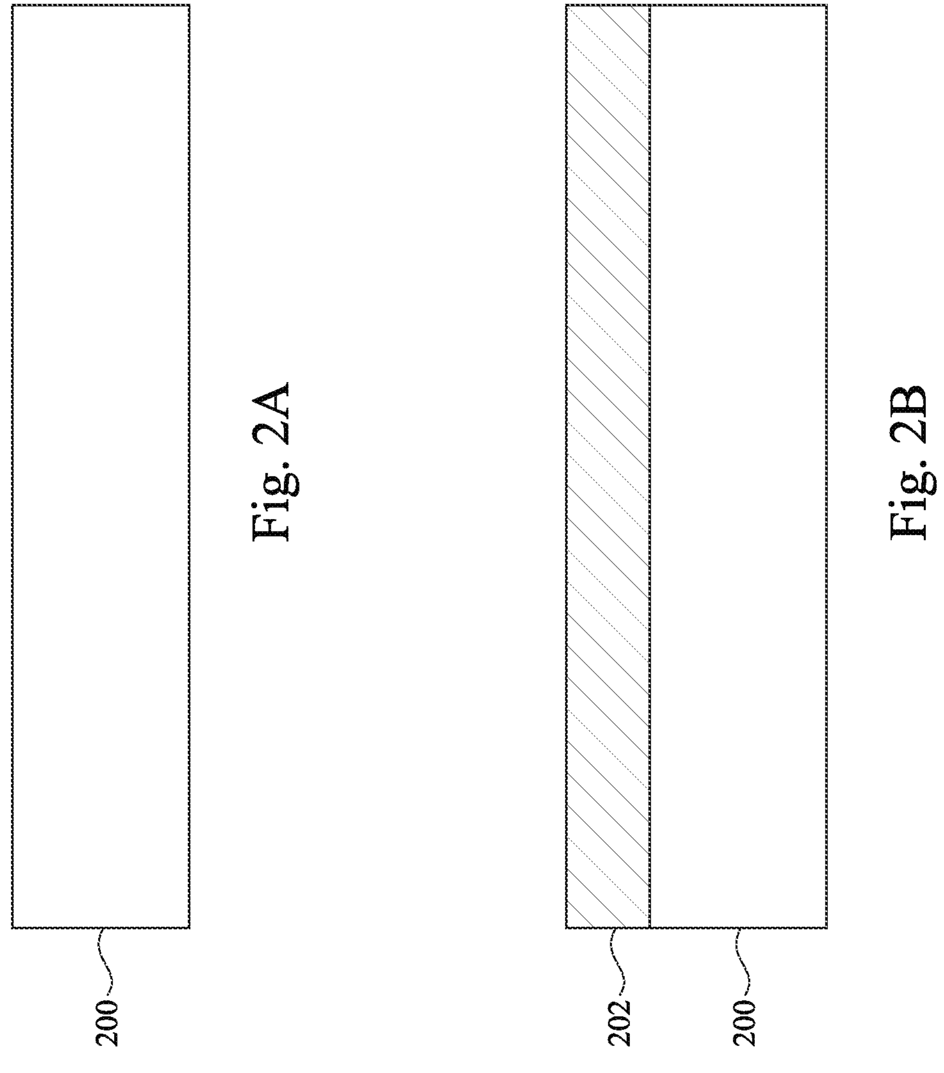
FIG. 2A is a cross-sectional view of a substrate prior to starting the method of FIG. 1A and FIG. 1B.
FIG. 2B is a cross-sectional view of a substrate with a first material layer located upon the substrate, again prior to starting the method of FIG. 1A and FIG. 1B.

Referring first to FIG. 2A, this figure shows one example of the beginning state of the substrate 200 prior to any processing steps. The substrate is usually a wafer made of a semiconducting material. Such materials can include silicon, for example in the form of crystalline Si or polycrystalline Si. In alternative embodiments, the substrate can be made of other elementary semiconductors such as germanium, or may include a compound semiconductor such as silicon carbide (SiC), gallium arsenide (GaAs), gallium carbide, gallium phosphide, indium arsenide (InAs), indium phosphide (InP), silicon germanium, silicon germanium carbide, gallium arsenic phosphide, or gallium indium phosphide. In particular embodiments, the wafer substrate is silicon. As illustrated here, no additional layers are present upon the substrate 200.

In contrast, in FIG. 2A, a first material layer 202 is present upon the substrate 200. The first material layer may be any material that may be used in a semiconducting device or integrated circuit. For example, the first material layer could be made of an insulating material, such as silicon dioxide ($SiO_2$) or silicon nitride (SiN), silicon oxynitride (SiON), fluoride-doped silicate glass, or other dielectric material. As another example, the first material layer could be made of an electrically conductive material, such as polysilicon or a metal like aluminum, copper, titanium, or tungsten. The discussion below proceeds with a first material layer being present, for illustrative purposes only and with it being understood that the substrate can also be etched.

It may be desirable to heat the substrate prior to beginning the photoresist patterning process. This optional heating step 101 may improve resist adhesion by desorbing water present on the substrate surface and to thermally crack any hydroxide bonds present on an oxidized surface. The substrate can be heated to temperatures above 100° C. up to, for example, 200° C. for a period of several minutes. The substrate is then cooled back down to room temperature.

Referring again to FIG. 1A, in optional step 102, one or more underlayers are applied to the substrate. In this regard, the term "underlayer" is relative to the photoresist layer, and refers to any layers which may be applied to the layer that is desired to be etched prior to applying the photoresist layer. Put another way, any layers between the layer to be etched and the photoresist layer can be considered an underlayer. In one non-limiting example illustrated in FIG. 3, two underlayers 204, 206 are applied upon the first material layer 202.

As one example, the lower underlayer 204 may be a bottom anti-reflective coating (BARC). When a photoresist layer is applied to a reflective substrate, light reflection from the substrate/resist interface can create variations in light exposure, that cause problems with critical dimension (CD) control. For example, light can reflect into areas where exposure was not intended, changing the desired pattern. A BARC can be applied between the substrate and the photoresist layer to minimize or eliminate such problems. Examples of suitable BARCs include amorphous carbon and various organic polymers. The BARC layer is typically formed by spin coating, though other methods can also be used. The BARC coating or film is then baked or cured to induce crosslinking and solvent removal, and hardening of the BARC. In some particular embodiments, the baking occurs at a temperature of about 125° C. to about 275° C. In particular embodiments, the baking takes place for a time of about 30 seconds to about 250 seconds. The baking can be performed using a hot plate or similar equipment.

As another example, the upper underlayer 206 may be a hard mask layer. The hard mask layer may be formed from a dielectric material, a metal, or other suitable material. Examples of suitable dielectric materials may include silicon carbide, silicon nitride, silicon oxycarbide, or silicon oxynitride. The hard mask layer may be formed by any suitable process such as chemical vapor deposition (CVD), low-pressure CVD (LPCVD), plasma-enhanced CVD (PECVD), physical vapor deposition (PVD), atomic layer deposition (ALD), or spin coating. The BARC layer and the hard mask layer are also typically selected to have significantly different etching sensitivity towards the same etchant. Combined with the photoresist layer, this multi-layer resist pattern can also help improve line width roughness (LWR).

When underlayers are used, as indicated in optional step 104 of FIG. 1A, the additive containing carbonate or bicarbonate anions can be mixed in with the materials for the underlayer or applied to either underlayer. This can be done by applying the additive in the liquid phase (e.g. a solution) or in the gas phase, for example during the baking/curing of the underlayer.

Figures 3, 4:
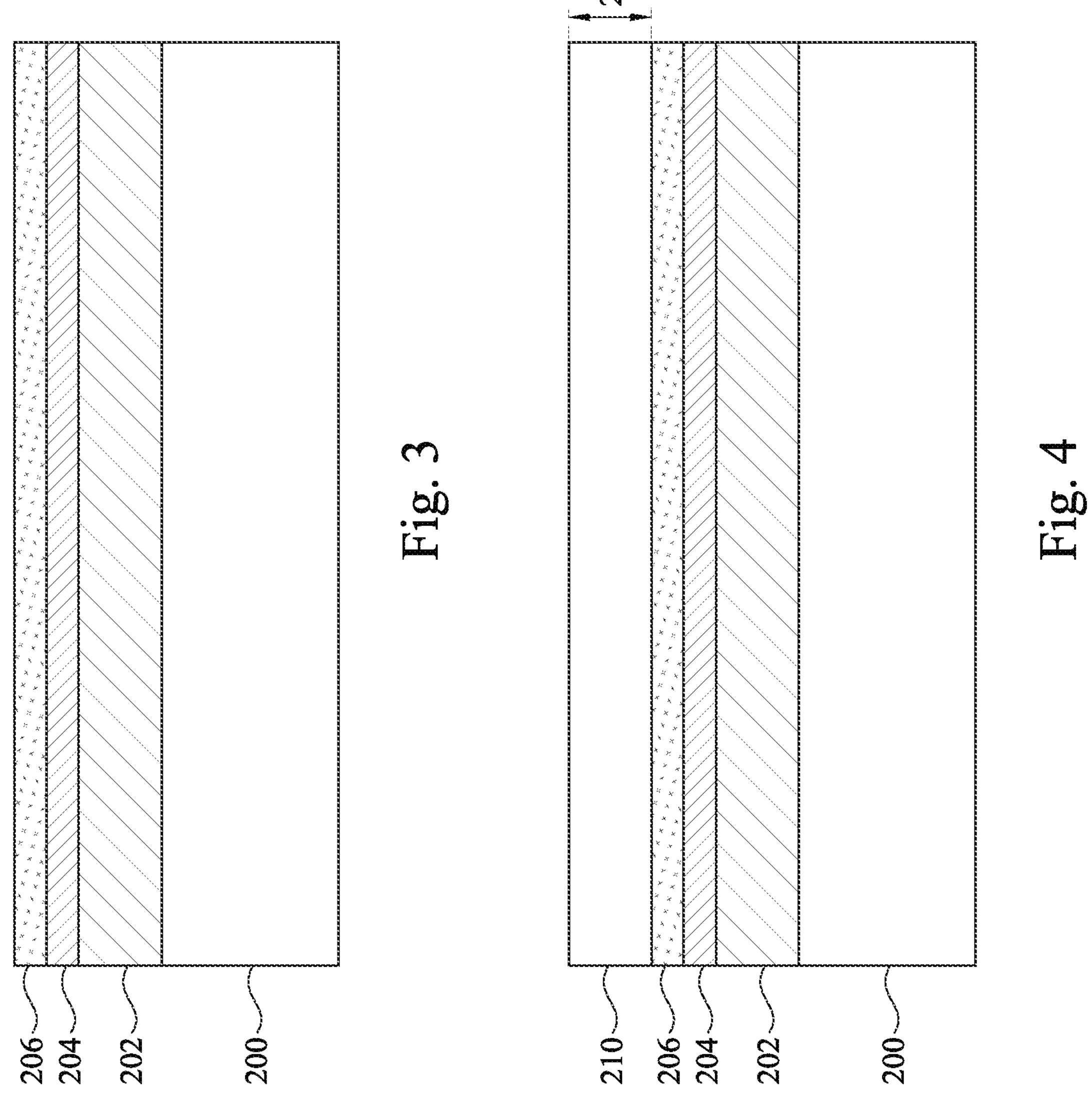
FIG. 3 is a cross-sectional view of the substrate with two underlayers applied upon the first material layer.
FIG. 4 is a cross-sectional view of the substrate with a photoresist layer applied upon the two underlayers.

Next, in step 105 of FIG. 1A and as illustrated in FIG. 4, a photoresist (PR) layer 210 is applied over the substrate. The photoresist layer is formed by applying the photoresist solution containing the metallic photoresist and/or the metallic cross-linker. If desired, the additive containing carbonate or bicarbonate anions can also be added into the photoresist solution. The photoresist solution may be applied, for example, by spin coating, or by spraying, roller coating, dip coating, or extrusion coating. Typically, in spin coating, the substrate is placed on a rotating platen, which may include a vacuum chuck that holds the substrate in plate. The photoresist solution is then applied to the center of the substrate. The speed of the rotating platen is then increased to spread the resist evenly from the center of the substrate to the perimeter of the substrate. The rotating speed of the platen is then fixed, which can control the thickness of the final photoresist layer. FIG. 4 shows the resulting structure after this step.

If desired, the additive containing carbonate or bicarbonate anions can be mixed directly into the photoresist solution. Alternatively, as indicated in optional step 106 of FIG. 1A, the additive containing carbonate or bicarbonate anions can be applied after the photoresist layer has been applied. Again, the additive could be applied in the liquid phase, for example by spraying or misting the treatment solution upon the photoresist layer.

Next, in step 110 of FIG. 1A, the photoresist solution is prebaked to remove the solvent and harden the photoresist layer. This may also be referred to as a softbake. In some particular embodiments, the prebake occurs at a temperature of about 40° C. to about 100° C., including from about 250° C. to about 800° C. or from about 90° C. to about 110° C. The time for the prebake may depend upon the thickness of the photoresist layer 210, with longer times for greater thicknesses, and in particular embodiments from about 10 seconds to about 10 minutes. Referring to FIG. 4, the photoresist layer 210 may have a thickness 215 of about 10 nanometers to about 100 nanometers. The baking can be performed using a hot plate or oven, or similar equipment.

As a result, the photoresist layer is formed on the substrate. The substrate and the other layers thereon are then cooled down to room temperature.

As indicated in optional step 112 of FIG. 1A, the additive containing carbonate or bicarbonate anions can be applied during or after the prebake. The additive could be applied as a liquid, or can be vaporized by the heating that occurs in the prebake step and be applied as a gas.

Figures 5, 6:
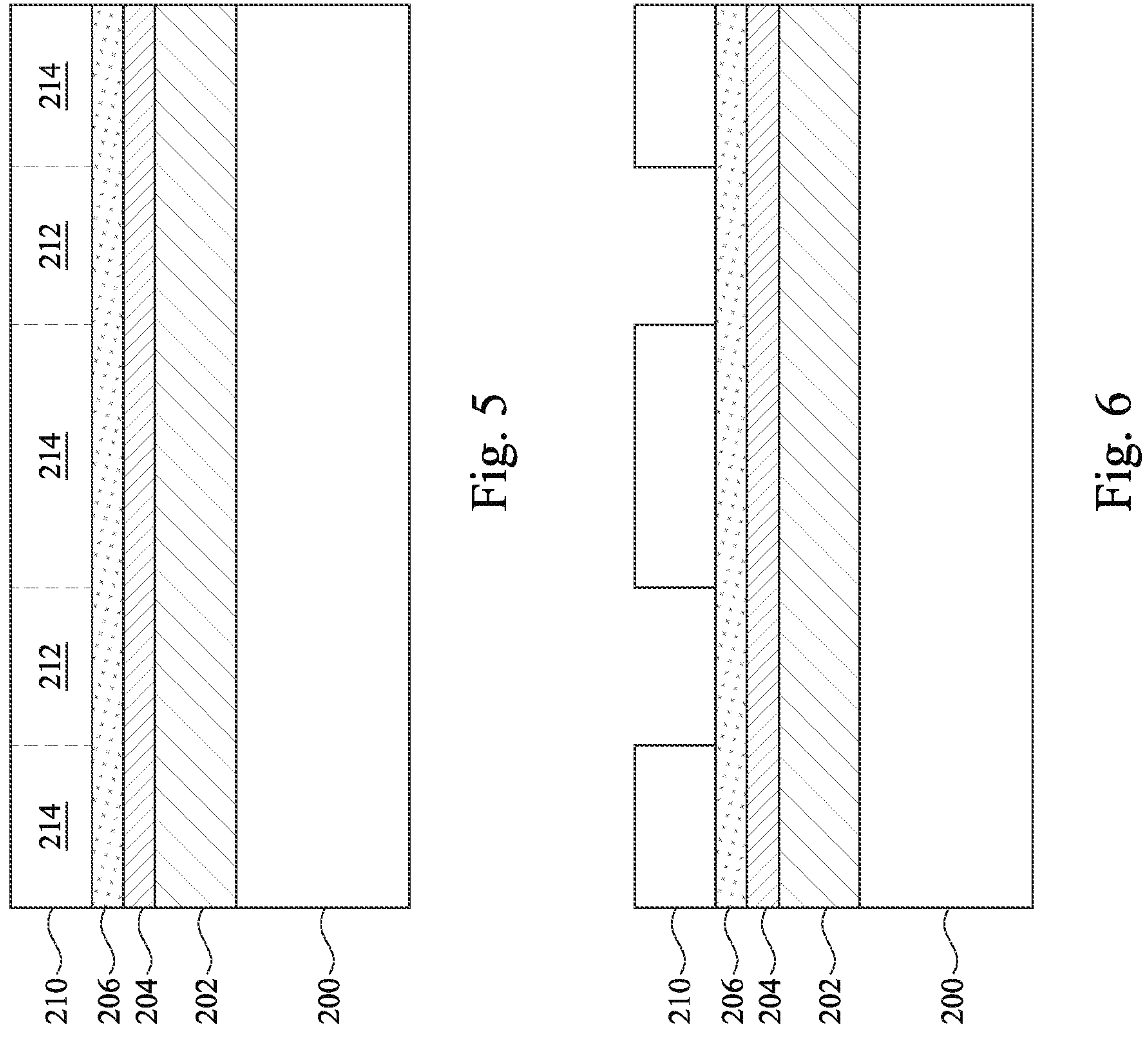
FIG. 5 is a cross-sectional view of the substrate after radiation exposure, with the photoresist layer now including soluble regions and insoluble regions.
FIG. 6 is a cross-sectional view of the substrate after development, with a patterned photoresist layer.

Continuing, in step 115 of FIG. 1A, the photoresist layer 210 is then patterned via exposure to radiation. The radiation may be any light wavelength which carries a desired mask pattern. In particular embodiments, EUV light having a wavelength of about 13.5 nm is used for patterning, as this permits smaller feature sizes to be obtained. In other embodiments, electron-beam (e-beam) radiation is used. Electron beams can be characterized by the energy of the beam, which in some embodiments ranges from about 5 volts (V) to about 200 kilovolts (kV). This step results in some portions of the photoresist layer being exposed to radiation, and some portions of the photoresist not being exposed to radiation. This exposure causes some portions of the photoresist to remain soluble in the developer and other portions of the photoresist to become insoluble in the developer. Referring now to FIG. 5, the photoresist layer 210 now includes soluble regions 212 and insoluble regions 214. It is noted for reference that EUV and e-beam radiation exposure typically occur under vacuum.

Optionally, in step 120 of FIG. 1A, a post exposure bake (PEB) occurs after the exposure to radiation. The PEB step can be used to complete any cross-linking within the photoresist, or to complete any chemically amplified reactions that may occur (for example if only the metallic cross-linker is used with the CAR). In addition, the PEB step may reduce mechanical stress that might build up during the prior steps. In some particular embodiments, the PEB occurs at a temperature of about 40° C. to about 250° C., including from about 100° C. to about 250° C. or from about 90° C. to about 150° C. The time for the PEB may range from about 10 seconds to about 10 minutes, and may vary depending on the thickness of the photoresist layer.

As indicated in optional step 122 of FIG. 1A, the additive containing carbonate or bicarbonate anions can be applied during or after the post exposure bake. The additive could be applied as a liquid or vaporized to enter the gas phase during the heating that occurs in the PEB step.

Next, in step 125 of FIG. 1A, the photoresist layer 210 is developed using a developer. The developer may be applied by spin coating, spraying, or other suitable process. The soluble portions of the photoresist layer are dissolved and washed away during the development step, leaving behind a patterned photoresist layer. This may be done, for example, by spin drying. Suitable developers may include PGMEA, PGME, PGEE, GBL, cyclohexanone, ethyl lactate, methanol, ethanol, propanol, n-butanol, acetone, DMF, isopropyl alcohol (IPA), THF, MIBC, n-butyl acetate, or MAK, i.e. the same solvent used in the photoresist solution. Other developers could include aqueous tetramethylammonium hydroxide (TMAH), isoamyl acetate, cyclohexanone, 5-methyl-2-hexanone, methyl-2-hydroxyisobutyrate, n-pentyl acetate, n-butyl propionate, n-hexyl acetate, n-butyl butyrate, isobutyl butyrate, 2,5-dimethyl-4-hexanone, 2,6-dimethyl-4-heptanone, propyl isobutyrate, or isobutyl propionate. Generally, any suitable developer may be used.

If desired, the additive containing carbonate or bicarbonate anions can be mixed directly into the developer. Alternatively, as indicated in optional step 126 of FIG. 1A, the additive containing carbonate or bicarbonate anions can be applied after the developer has been applied and then washed off the substrate. Again, the additive could be applied in the liquid phase, for example by spraying or misting the treatment solution. The resulting structure is illustrated in FIG. 6. As seen here, the soluble regions have been washed away, resulting in a patterned photoresist layer.

In optional step 130 of FIG. 1A, a post develop bake or "hardbake" may be performed after development. This can be done to stabilize the photoresist pattern after development, for optimum performance in subsequent steps. In some particular embodiments, the hardbake occurs at a temperature of about 100° C. to about 160° C. The time for the hardbake may range from about 1 minute to about 10 minutes, and may vary depending on the thickness of the photoresist layer.

As indicated in optional step 132 of FIG. 1A, the additive containing carbonate or bicarbonate anions can be applied during or after the hardbake. The additive could be applied as a liquid (i.e. treatment solution) or vaporized to enter the gas phase during the heating that occurs in the hardbake step.

Continuing, then, portions of the upper underlayer 206, the lower underlayer 204, and the first material layer 202 are exposed below the first patterned photoresist layer are now exposed.

In optional step 134 of FIG. 1A, the underlayer(s) 206, 204 are etched, thus transferring the photoresist pattern to the underlayers. Then, in step 140 of FIG. 1A, the first material layer 202 is etched, thus transferring the photoresist pattern to the first material layer. Desirably, each of the etchants for these layers differs significantly from that of the other layers, which improves the LWR in the first material layer.

Generally, these etching steps may be performed using wet etching, dry etching, or plasma etching processes such as reactive ion etching (RIE) or inductively coupled plasma (ICP), or combinations thereof, as appropriate. The etching may be anisotropic. Depending on the material, etchants may include carbon tetrafluoride ($CF_4$), hexafluoroethane ($C_2F_6$), octafluoropropane ($C_3F_8$), fluoroform ($CHF_3$), difluoromethane ($CH_2F_2$), fluoromethane ($CH_3F$), trifluoromethane ($CHF_3$), carbon fluorides, nitrogen ($N_2$), hydrogen ($H_2$), oxygen ($O_2$), argon (Ar), xenon (Xe), xenon difluoride ($XeF_2$), helium (He), carbon monoxide (CO), carbon dioxide ($CO_2$), fluorine ($F_2$), chlorine ($Cl_2$), oxygen ($O_2$), hydrogen bromide (HBr), hydrofluoric acid (HF), nitrogen trifluoride ($NF_3$), sulfur hexafluoride ($SF_6$), boron trichloride ($BCl_3$), ammonia ($NH_3$), bromine ($Br_2$), nitrogen trifluoride ($NF_3$), or the like, or combinations thereof in various ratios. For example, silicon dioxide can be wet etched using hydrofluoric acid and ammonium fluoride. Alternatively, silicon dioxide can be dry etched using various mixtures of $CHF_3$, $O_2$, $CF_4$, and/or $H_2$.

Referring now to FIG. 1B, the two different treatment options are shown more clearly here. In the photoresist coating step 105 and the developing step 125, the additive can be directly mixed into the photoresist solution or the development solution. This is indicated in dotted lines. Alternatively, the additive can be used in the form of a treatment solution which is applied to the photoresist. More desirably, the additive is used before, during, or after a step in which energy is added to the photoresist. Those include the radiation exposure step 115, the pre-bake step 110, and the post exposure bake step 120, in which light energy or thermal energy are added. This is indicated with solid lines.

Figure 7:
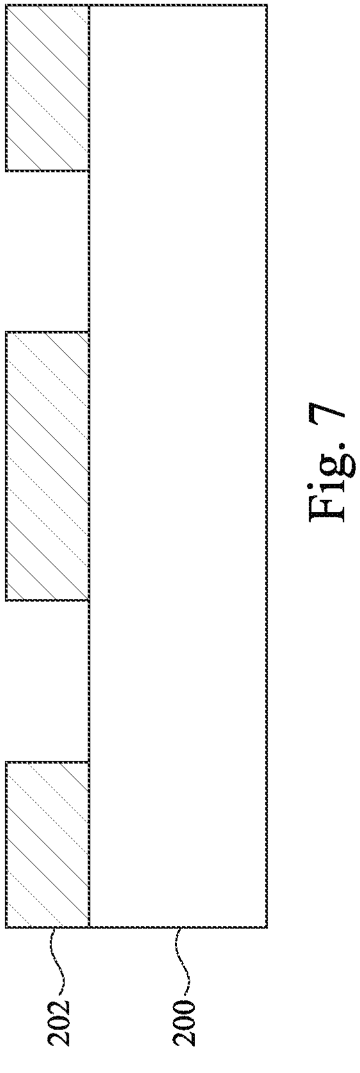
FIG. 7 is a cross-sectional view of the final structure with a patterned first material layer.

Next, in step 145 of FIG. 1A, the patterned photoresist layer 210 is removed. In optional step 146, the upper underlayer 206 is removed. In optional step 148, the lower underlayer 204 is removed. The photoresist layer, the upper underlayer, and the lower underlayer can be removed using conventional means such as plasma stripping, solvent, or chemical-mechanical planarization (CMP). The resulting structure is illustrated in FIG. 7, with the first material layer 202 being patterned.

Figure 8:
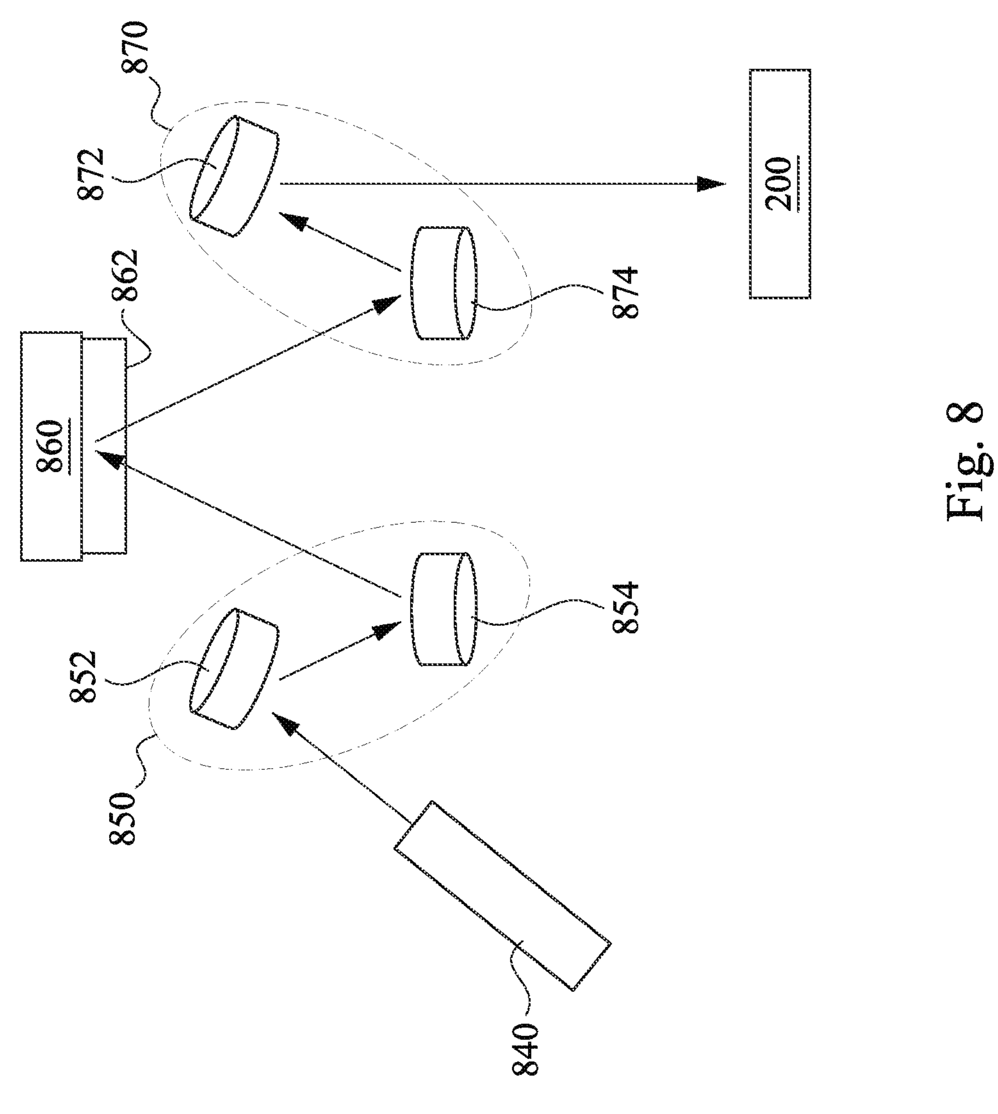
FIG. 8 is an illustration of an extreme ultraviolet (EUV) photolithography system for exposing the photoresist layer to EUV radiation, in accordance with some embodiments.

FIG. 8 is an illustrative schematic diagram, not drawn to scale, illustrating the various components of an extreme ultraviolet (EUV) photolithography system which generates the radiation to which the photoresist is exposed. Generally, the EUV photolithography system 800 begins with an EUV light source 840 that generates EUV light or radiation. Downstream of the EUV light source is an illumination stage 850 in which the EUV light may be collected and focused as a beam, for example using field facet mirror 852 that splits the beam into a plurality of light channels. These light channels can then directed using one or more relay mirrors 854 onto the plane of the photomask. The photomask 860 may include a pellicle membrane 862, through which the radiation passes before and/or after contacting the photomask. Downstream of the photomask 860 is the projection optics module 870, which is configured for imaging the pattern of the photomask onto the semiconductor wafer substrate 200. The projection optics module 870 may include refractive optics or reflective optics for carrying the image of the pattern defined by the photomask. Illustrative mirrors 872, 874 are shown. The lithography system can include other modules or be integrated with or coupled to other modules.

Additional processing steps may be performed to fabricate a semiconductor device or integrated circuit. Examples of such steps may include ion implantation, deposition of other materials, etching, etc.

Use of the metallic photoresist with specified ligands, the metallic cross-linker, and/or the additive containing carbonate or bicarbonate anions provides some advantages. The radiation dosage can be reduced by 5% or more while still obtaining patterns with high resolution and good LWR. The photoresist may have improved thermal stability as well, which also improves pattern fidelity. Processes with a pitch of 40 nanometers or lower can be improved using these components in the photoresist.

Some embodiments of the present disclosure thus relate to methods that use a photoresist solution. A semiconducting wafer substrate is coated with a photoresist solution. The photoresist solution includes a metallic photoresist or a cross-linker. The metallic photoresist comprises a metal core and one or more ligands attached to the core. Each ligand is saturated and comprises from 1 to about 8 carbon atoms and at least two nitrogen atoms. Alternatively, the cross-linker comprises a metal core and a plurality of cross-linking groups, and has a molecular weight of about 1000 or less.

Other embodiments of the present disclosure relate to a photoresist solution that comprises a metallic photoresist or a cross-linker. The metallic photoresist comprises a metal core and one or more ligands attached to the core. Each ligand is saturated and comprises from 1 to about 8 carbon atoms and at least two nitrogen atoms. Alternatively, the cross-linker comprises a metal core and a plurality of cross-linking groups, and has a molecular weight of about 1000 or less. The photoresist solution may include both the specified metallic photoresist and the cross-linker, or only one of these components.

Finally, other embodiments of the present disclosure relate to methods that use a photoresist solution. The substrate is coated with a photoresist solution. The coated substrate is pre-baked to cure the photoresist solution and form a photoresist layer. The photoresist layer is then exposed to radiation to pattern the photoresist layer. An optional post-exposure bake of the coated substrate may be performed. The patterned photoresist layer is then developed using a developer. The photoresist solution or the developer may include an additive comprising carbonate or bicarbonate anions. Alternatively, the coated substrate is treated with a treatment solution that contains an additive comprising carbonate or bicarbonate anions during or after the coating, pre-baking, exposing, optional post-exposure bake, or developing steps.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

coating a substrate with a photoresist solution that includes a metallic component and a cross-linker;

wherein:

(A) the metallic component comprises:

a metal core; and one or more ligands attached to the core, the cross-linker comprises:

a metal core and a plurality of cross-linking groups;

wherein the cross-linker has a molecular weight of about 1000 or less; and wherein each ligand of the metallic component has one of the following chemical structures:

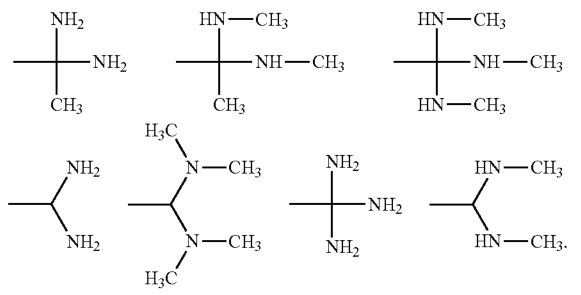

2. The method of claim 1, wherein the metal core of the metallic component or the metal core of the cross-linker comprises Ag, Cd, In, Sn, Sb, Te, Cs, Au, Hg, Ti, Pb, Bi, Po, At, Ba, La, or Ce.

3. The method of claim 1, wherein the metal core of the metallic component comprises from about 0.01 wt % to about 7 wt % of the photoresist solution.

4. The method of claim 1, wherein the photoresist solution further comprises a solvent comprising propylene glycol methyl ether acetate (PGMEA), propylene glycol monomethyl ether (PGME), 1-ethoxy-2-propanol (PGEE), gamma-butyrolactone (GBL), cyclohexanone (CHN), ethyl lactate (EL), methanol, ethanol, propanol, n-butanol, acetone, dimethylformamide (DMF), isopropyl alcohol (IPA), tetrahydrofuran (THF), methyl isobutyl carbinol (MIBC), n-butyl acetate (nBA), or 2-heptanone (MAK).

5. The method of claim 1, wherein the metal core of the cross-linker comprises covalently bonded metal oxides.

6. The method of claim 1, wherein the plurality of cross-linking groups of the cross-linker comprise —OH, —COOR, $—NH_2$, or —SH, wherein R is hydrogen or alkyl.

7. The method of claim 1, wherein the cross-linker further comprises a saturated linking group between the metal core and each cross-linking group.

8. The method of claim 7, wherein the saturated linking group comprises from 1 to about 20 carbon atoms.

9. The method of claim 1, wherein the cross-linker has one of the following chemical structures:

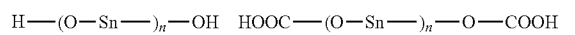
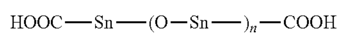
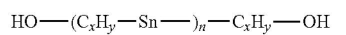
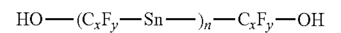
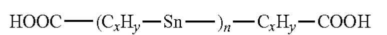
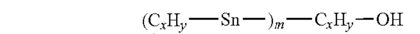
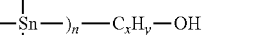
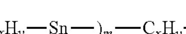
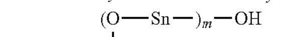
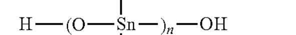
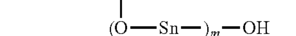
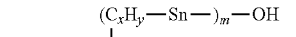
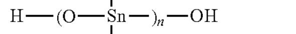
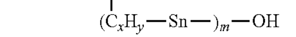
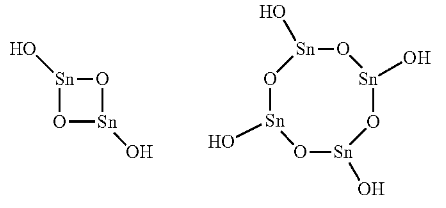

wherein x is 1 to 20, m and n are independently 1 to 20, and y=2x.

10. The method of claim 1, wherein the metal core of the cross-linker comprises from about 0.001 wt % to about 5 wt % of the photoresist solution.

11. A photoresist solution, comprising:

a metallic component or a cross-linker;

wherein either:

(A) the metallic component comprises:

a metal core; and one or more ligands attached to the core, wherein each ligand has one of the following structures:

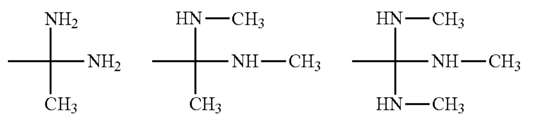

-continued

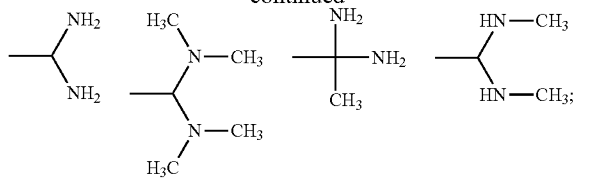

or (B) the cross-linker has one of the following chemical structures:

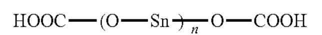
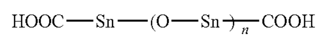
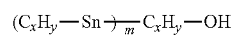
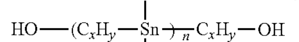
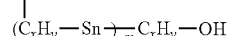
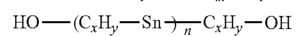
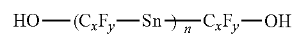
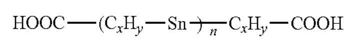
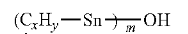
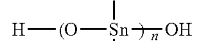
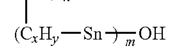

wherein x is 1 to 20, m and n are independently 1 to 20, and y=2x.

12. The photoresist solution of claim 11, wherein the photoresist solution includes both the metallic component and the cross-linker.

13. A method, comprising:

coating a substrate with a photoresist solution that includes a metallic component and a cross-linker, wherein;

(A) the metallic component comprises:

a metal core; and one or more ligands attached to the core; and (B) the cross-linker comprises:

a metal core; and a plurality of cross-linking groups, wherein the cross-linking groups are —OH, —COOR, $—NH_2$, or —SH, wherein R is hydrogen or alkyl;

wherein the cross-linker has a molecular weight of about 1000 or less; and wherein each ligand of the metallic component has one of the following chemical structures:

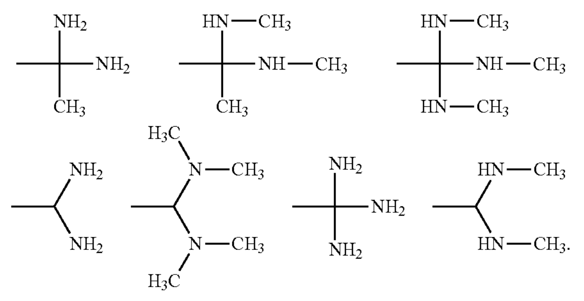

14. The method of claim 13, wherein the metal core of the metallic component and the metal core of the cross-linker independently comprise Ag, Cd, In, Sn, Sb, Te, Cs, Au, Hg, Ti, Pb, Bi, Po, At, Ba, La, or Ce.

* * * * *